US008629928B1

(12) United States Patent  
Koifman (10) Patent No.: US 8,629,928 B1  
(45) Date of Patent: Jan. 14, 2014

(54) PIXEL AND METHOD FOR FEEDBACK BASED RESETTING OF A PIXEL

(75) Inventor: Vladimir Koifman, Rishon Lezion (IL)

(73) Assignee: Pixim Israel Ltd., Raanana (IL)

( * ) Notice: Subject to any disclaimer, the term of this patent is extended or adjusted under 35 U.S.C. 154(b) by 21 days.

(21) Appl. No.: 13/535,379

(22) Filed: Jun. 28, 2012

(51) Int. Cl.
*H04N 3/14* (2006.01)
*H04N 5/335* (2011.01)

(52) U.S. Cl.
USPC .......................................... 348/308; 348/302

(58) Field of Classification Search
USPC ............... 348/294–297, 302–310; 250/208.1; 257/215, 291–292
See application file for complete search history.

(56) References Cited

U.S. PATENT DOCUMENTS

| 6,798,451 | B1 * | 9/2004 | Suzuki et al. | 348/294 |
| 6,917,027 | B2 * | 7/2005 | Krymski | 250/208.1 |
| 7,215,369 | B2 * | 5/2007 | Beck et al. | 348/308 |
| 7,375,751 | B2 * | 5/2008 | Lee et al. | 348/294 |
| 7,542,085 | B2 * | 6/2009 | Altice et al. | 348/296 |
| 8,471,938 | B2 * | 6/2013 | Altice et al. | 348/296 |
| 2009/0135284 | A1 * | 5/2009 | Altice et al. | 348/308 |
| 2009/0219421 | A1 * | 9/2009 | Altice et al. | 348/296 |

* cited by examiner

*Primary Examiner* — Kelly L Jerabek
(74) *Attorney, Agent, or Firm* — Rader, Fishman & Grauer PLLC (57) ABSTRACT

A storage system, a non-transitory computer readable medium and a method for pre-fetching. The method may include presenting, by a storage system and to at least one host computer, a logical address space; determining, by a fetch module, to fetch a certain data portion from a data storage device to a cache memory of the storage system; determining, by a pre-fetch module, whether to pre-fetch at least one additional data portion from at least one data storage device to the cache memory based upon at least one characteristic of a mapping tree that maps one or more contiguous ranges of addresses related to the logical address space and one or more contiguous ranges of addresses related to the physical address space; and pre-fetching the at least one additional data portions if it is determined to pre-fetch the at least one additional data portions.

24 Claims, 7 Drawing Sheets

PIXEL AND METHOD FOR FEEDBACK BASED RESETTING OF A PIXEL

FIELD OF THE INVENTION

The invention relates to methods for compensating for noises such as reset and KTC noises and to devices that have noise compensation capabilities.

BACKGROUND OF THE INVENTION

Digital cameras include a two-dimensional photo-detector array. A single pixel can include one or more photo-detectors as well as multiple transistors. Typical photo-detectors include photodiodes, phototransistors, photo-gates, hole accumulation diodes, pinned diodes, avalanche diodes, buried accumulation and transfer layer devices.

The performance of CMOS pixels is limited by their thermal noise. This noise is also known as reset noise of KTC noise. During a reset phase of the pixel a reset voltage is provided to the pixel and especially to a reset transistor of the pixel. When this reset phase ends the reset transistor enters a non-conductive stage and thermal noise is generated.

Various prior art pixels are known. The most commonly used pixels are either CCD pixels or CMOS pixels. Prior art CMOS pixels and two dimensional CMOS arrays are illustrated in the following U.S. patents which are incorporated herein by reference: U.S. Pat. No. 6,777,660 of Lee, titled "CMOS active pixel reset noise reduction"; U.S. Pat. No. 6,762,401 of Lee, titled "CMOS image sensor capable of increasing fill factor and driving method thereof"; U.S. Pat. No. 6,567,495 of Harada titled "solid-state imaging device and a method of reading a signal charge in a solid-state imaging device which can reduce smear and can provide an excellent image characteristics"; U.S. Pat. No. 6,750,912 of Tennant et al., titled "Active-passive imager pixel array with small groups of pixels having short common bus lines"; U.S. Pat. No. 6,697,111 of Kozlowski et al., titled "compact low-noise active pixel sensor with progressive row reset"; U.S. Pat. No. 6,665,013 of Fossum et al., titled "active pixel sensor having intra-pixel charge transfer with analog-to-digital converter"; U.S. Pat. No. 6,587,142 of Kozlowski et al., titled "low-noise active-pixel sensor for imaging arrays with high speed row reset"; U.S. Pat. No. 6,538,245 of Kozlowski, titled "amplified CMOS transducer for single photon read-out of photo-detectors"; U.S. Pat. No. 6,532,040 of Kozlowski et al., titled "low-noise active-pixel sensor for imaging arrays with high-speed row reset"; U.S. Pat. No. 5,892,540 of Kozlowski et al., titled "low noise amplifier for passive pixel CMOS imager"; U.S. Pat. No. 5,238,276 of Dhuse et al., titled "imaging system having a sensor array reset noise reduction mechanism" and U.S. Pat. No. 6,326,230 of Pain et al., titled "high speed CMOS imager with motion artifact suppression and anti-blooming".

Correlated double sampling is a well known technique that can reduce thermal noise but it is based upon dedicated components that enable sampling of various signals. Furthermore—it is applicable to roller shutter pixel arrays in which different pixels are exposed to light during different periods and is not applicable to global shutter arrays in which all pixels are exposed to light during the same period.

There is a need to provide efficient means to improve pixel performances.

SUMMARY OF THE INVENTION

According to an embodiment of the invention a method for reset noise compensation may be provided and may include (a) resetting a photodiode of the pixel by activating a first transistor connected to the photodiode at a first node; (b) setting a voltage of a second node to a predefined value by activating a third transistor that couples the second node to a first conductor that is connected to a voltage source; (c) deactivating the first transistor and activating a second transistor that is connected between the first node and the second node; (d) deactivating the third transistor and measuring the voltage of the second node to provide a measurement result, by activating a fourth transistor and a fifth transistor, wherein the fourth transistor is connected to the second node and to the fifth transistor and wherein the first transistor is connected to the first conductor; (e) evaluating, based upon the measurement result, the predefined value and a gain factor, a value of a compensation signal to be provided to a feedback node that is connected to the second node via a feedback capacitor; wherein the gain factor is indicative of a ratio between changes in a voltage of the feedback node and changes induced in the voltage of the second node as a result of the changes in the voltage of the feedback node; and (f) providing the compensation signal to the feedback node.

The method may one or more iterations of noise compensation, measurements of second node voltage and additional compensation.

The method may include (g) measuring, after completion of the providing of the compensation signal, the voltage of the second node to provide another measurement result; (h) determining whether to provide to the second node another compensation signal; and (i) if it is determined to provide the other compensation signal then evaluating a value of the other compensation signal and providing the other compensation signal to the second node.

Additional embodiments of the invention include a device arranged to execute the method described above, including any stages—and any combinations of same. For example, the device may include an array of pixels and a control unit. The array of pixels may include multiple ideally identical pixels.

The pixel may include a photodiode and first till fifth transistors; wherein the photodiode, the first transistor and the second transistor are connected to a first node; wherein the second transistor, third transistor and fourth transistor are connected to a second node; wherein the fifth transistor is connected between the fourth transistor and a first conductor. The control circuit may be arranged to: (a) activate the first transistor to facilitate a reset of the photodiode; (b) activate the third transistor to set a voltage of a second node to a predefined value; (c) deactivate the first transistor and activate the second transistor; (d) deactivate the third transistor and activate the fourth and fifth transistors to allow a reception of a fifth transistor signal indicative of the voltage of the second node; (e) measure the fifth transistor signal to provide a measurement result; (f) evaluate, based upon the measurement result, the predefined value and a gain factor, a value of a compensation signal to be provided to a feedback node that is connected to the second node via a feedback capacitor; wherein the gain factor is indicative of a ratio between changes in a voltage of the feedback node and changes induced in the voltage of the second node as a result of the changes in the voltage of the feedback node; and (g) provide the compensation signal to the feedback node.

The control circuit is arranged to (h) deactivate the third transistor and activate the fourth and fifth transistors to allow an another reception of the fifth transistor signal; (i) measure the fifth transistor signal to provide another measurement result; (j) determine whether to provide to the second node another compensation signal; and if it is determined to provide the other compensation signal then (k) evaluate a value of the other compensation signal and provide the other compensation signal to the second node.

The gain factor may be smaller than twenty percent, may range between ten percent and two percent, may be smaller than ten percent or have other values.

According to an embodiment of the invention the pixel may include the feedback node and the control circuit may be arranged to provide the compensation signal to the feedback node of the pixel by activating a sixth transistor (of the pixel) that is connected to the feedback node.

According to an embodiment of the invention the pixel the feedback node can belong to another pixel. That other pixel can be adjacent to the pixel, can belong to an adjacent row, to a non-adjacent row, and the like.

The feedback node of the other pixel can be connected between a fourth transistor and a fifth transistor of the other pixel.

The pixel can include a feedback node that is used for compensating noise of a further pixel. The feedback node can be connected to a second transistor of the other pixel.

The pixel may belong to an array of pixels that are activated simultaneously.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

It will be appreciated that for simplicity and clarity of illustration, elements shown in the figure s have not necessarily been drawn to scale. For example, the dimensions of some of the elements may be exaggerated relative to other elements for clarity. Further, where considered appropriate, reference numerals may be repeated among the figure s to indicate corresponding or analogous elements.

DETAILED DESCRIPTION OF THE DRAWINGS

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings.

It will be appreciated that for simplicity and clarity of illustration, elements shown in the figure s have not necessarily been drawn to scale. For example, the dimensions of some of the elements may be exaggerated relative to other elements for clarity. Further, where considered appropriate, reference numerals may be repeated among the figure s to indicate corresponding or analogous elements.

Because the illustrated embodiments of the present invention may for the most part, be implemented using electronic components and circuits known to those skilled in the art, details will not be explained in any greater extent than that considered necessary as illustrated above, for the understanding and appreciation of the underlying concepts of the present invention and in order not to obfuscate or distract from the teachings of the present invention.

Additional embodiments of the invention include a device arranged to execute the method described above, including any stages—and any combinations of same. For example, the device may include an array of pixels and a control unit. The array of pixels may include multiple ideally identical pixels.

Figure 1:
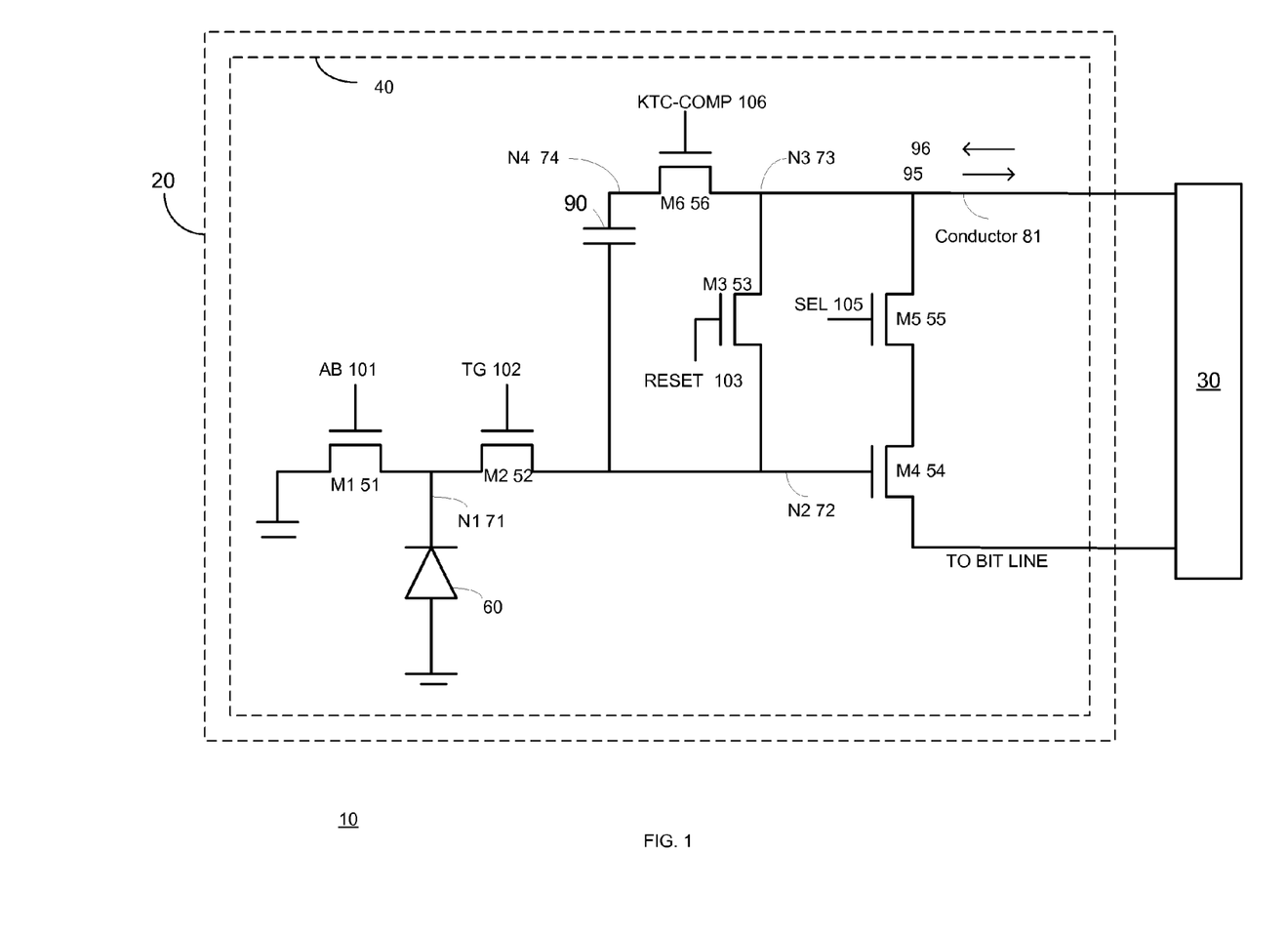
FIG. 1 illustrates a device and a pixel of the device according to an embodiment of the invention.

FIG. 1 illustrates a device and a pixel of the device according to an embodiment of the invention.

Device 10 includes a pixel array 20 and a control circuit 30. The pixel array 20 may include multiple pixels that are arranged in rows and columns. The pixels are ideally identical to each other—under perfect manufacturing conditions the pixels should be exactly equal to each other.

FIG. 1 illustrates a pixel 40 of the pixel array 20. The pixel 40 includes a photodiode 60 and first till fifth transistors 51-56. The photodiode 60, the first transistor 51 and the second transistor 52 are connected to a first node 71. The second transistor 51, third transistor 53 and fourth transistor 54 are connected to a second node 72. The fifth transistor 55 is connected between the fourth transistor 54 and a first conductor 81.

The control circuit 30 may be arranged to:
(a) activate the first transistor 51 to facilitate a reset of the photodiode 60,
(b) activate the third transistor 53 to set a voltage of a second node 72 to a predefined value;
(c) deactivate the first transistor 51 and activate the second transistor 52;
(d) deactivate the third transistor 53 and activate the fourth and fifth transistors 54 and 55 to allow a reception of a fifth transistor signal 95 indicative of the voltage of the second node 72;
(e) measure the fifth transistor signal 95 to provide a measurement result; the fifth transistor signal can be current (as in the case of FIG. 1) or voltage;
(f) evaluate, based upon the measurement result, the predefined value and a gain factor, a value of a compensation signal 96 to be provided to a feedback node 74 that is connected to the second node 72 via a feedback capacitor 90; wherein the gain factor is indicative of a ratio between changes in a voltage of the feedback node 74 and changes induced in the voltage of the second node 72 as a result of the changes in the voltage of the feedback node 74; and
(g) provide the compensation signal 96 to the feedback node 74. The compensation signal changes the voltage of the feedback node 74 and this in turn changes (by the gain factor) the voltage of the second node 72 and thus compensates (reduced or even eliminates) any noises introduced to the second node 72 due to the reset and the activation of the second transistor.

FIG. 1 illustrates N-type CMOS transistors. It is noted that other types of transistors can be used.

The drain of the first transistor 51 is grounded. The gate of the first transistor 51 is arranged to receive a first control signal (AB) 101. The source of the first transistor 51 is connected to the first node 71. The cathode of the photodiode 60 is connected to the first node 71. The anode of the photodiode 60 is grounded.

The drain of the second transistor 52 is connected to the second node 72. The gate of the second transistor 52 is arranged to receive a second control signal (TG) 102. The source of the second transistor 52 is connected to the first node 71.

The drain of the third transistor 53 is connected to a third node 53. The gate of the third transistor 53 is arranged to receive a third control signal (RST) 103. The source of the third transistor 53 is connected to the second node 72.

The source of the fourth transistor 54 is grounded. The gate of the fourth transistor 54 is connected to the second node 72. The source of the fourth transistor 54 is connected to the drain of the fifth transistor 55.

The source of the fifth transistor 55 is connected to the third node 73. The gate of the fifth transistor 55 is arranged to receive a fifth control signal (SEL) 105.

The drain of the sixth transistor 56 is connected to the third node 73. The gate of the sixth transistor 56 is arranged to receive a sixth control signal (KTC_COMP) 106. The source of the sixth transistor 56 is connected to the feedback node 74.

The compensation process may include a single iteration of measurements and compensation but may include multiple measurements and compensation. The number of iterations can be set in advance or may vary according to the results of previous iterations (for example—when reaching a small enough error).

The control circuit is arranged to (h) deactivate the third transistor 53 and activate the fourth and fifth transistors 54 and 55 to allow an another reception of the fifth transistor signal; (i) measure the fifth transistor signal to provide another measurement result; (j) determine whether to provide to the second node another compensation signal; and if it is determined to provide the other compensation signal then (k) evaluate a value of the other compensation signal and provide the other compensation signal to the second node.

The feedback capacitor 90 can be relatively small in relation to other capacitances of the pixel, especially capacitances that are coupled to the second node. Non-limiting values of these other capacitances are about $0.7-2*10^{-12}$ Farad, and the feedback capacitor 50 can have a capacitance that is between 2-10% of these capacitances.

Thus, the gain factor (ratio between changes of the feedback voltage to changes in the voltage of the second node) can be small and even very small—and this may allow a provision of inaccurate compensation signals to the feedback node—as any inaccuracies will result in much smaller (1/gain factor) deviations in the voltage of the second node 72.

The gain factor may be smaller than twenty percent, may range between ten percent and two percent, may be smaller than ten percent or have other values.

According to an embodiment of the invention instead of having a dedicated feedback node 74 and a dedicated sixth transistor 56—the pixel 40 may include only five transistors and a certain node of another pixel may be used as a feedback node of the pixel 40. That other pixel can be adjacent to pixel 40, can be spaced apart from pixel 40, can belong to a pixel of an adjacent row, can belong to a pixel of a non-adjacent row, and the like. Additionally or alternatively—one of the nodes of the pixel 40 can be used as a feedback node to yet a further pixel.

Figure 2:
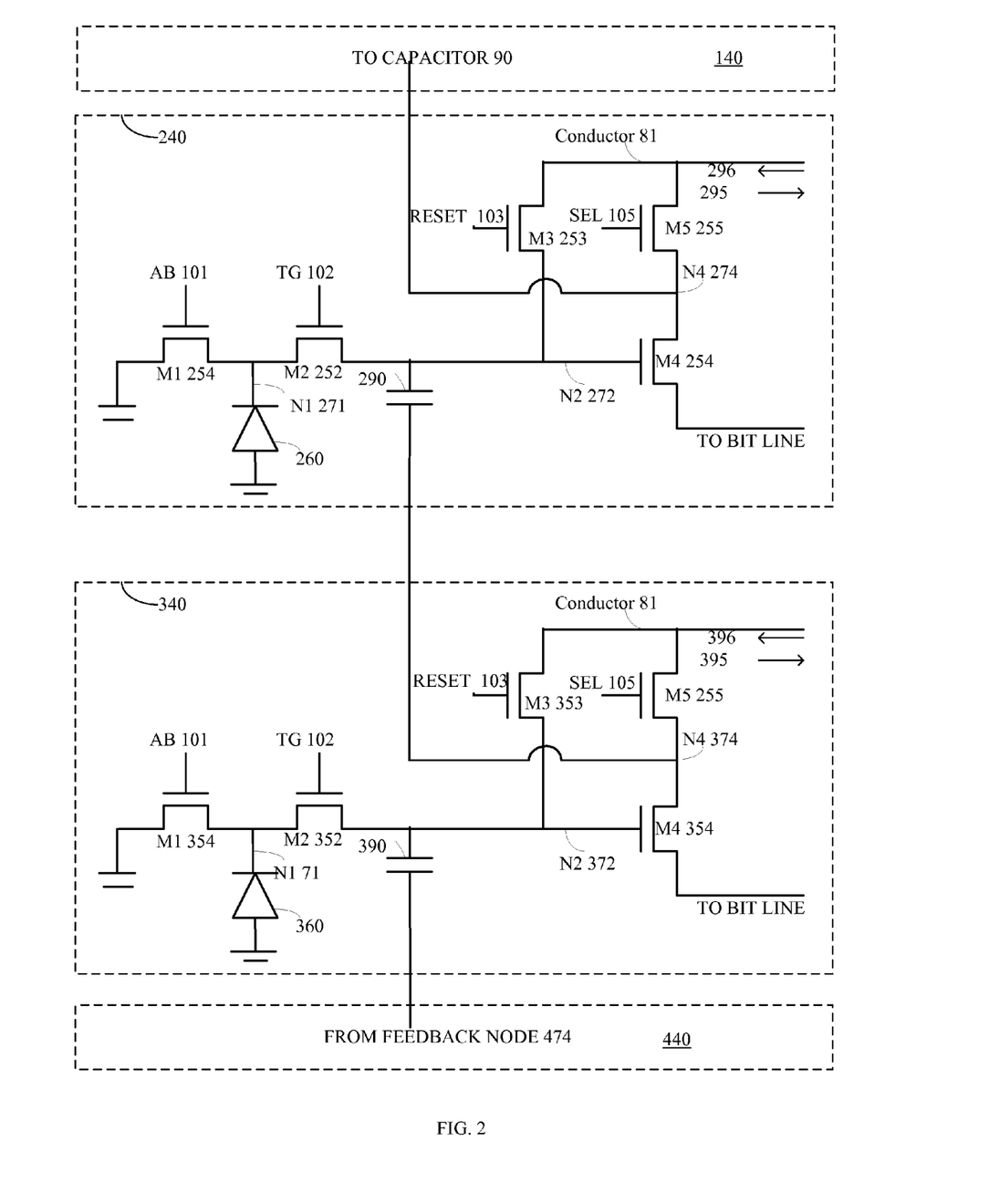
FIG. 2 illustrates multiple pixels according to an embodiment of the invention.

FIG. 2 illustrates multiple pixels 140, 240, 340 and 440 according to an embodiment of the invention.

Pixel 240 belong to a certain row (row N) while pixel 340 is illustrates as belonging to an adjacent row (N+1) of the pixel array 20. FIG. 2 also illustrates an arrow to another pixel 140 of a further row (N–1) and a further pixel 440 that belongs to row (N+2).

Pixels 140, 240, 340 and 440 are ideally identical to each other and are connected to the same control circuit 30, although each pixel may be connected to its own control circuit.

Pixels 140 and 440 are illustrates as boxes, for simplicity of explanation only.

Pixels, 140, 240, 340 and 440 differ from pixel 40 of FIG. 1 by the following: (a) they do not include sixth transistor 56, (b) they do not include a dedicated feedback node 74 for compensating the voltage of their second node, (c) the node that connects their fourth and fifth transistors is used as a feedback node to another pixel, (d) compensation signal that is aimed to compensate noise of a second node of a pixel (for example pixel 240) is sent to another pixel (for example—pixel 340).

Pixel 240 includes a photodiode 260 and first till fifth transistors 251-255. The photodiode 260, the first transistor 251 and the second transistor 252 are connected to a first node 271. The second transistor 251, third transistor 253 and fourth transistor 254 are connected to a second node 272. The fifth transistor 255 is connected between the fourth transistor 254 and a first conductor 281. The control circuit 30 may be arranged to: (a) activate the first transistor 251 to facilitate a reset of the photodiode 260, (b) activate the third transistor 253 to set a voltage of a second node 272 to a predefined value; (c) deactivate the first transistor 251 and activate the second transistor 252; (d) deactivate the third transistor 253 and activate the fourth and fifth transistors 254 and 255 to allow a reception of a fifth transistor signal 295 indicative of the voltage of the second node 272; (e) measure the fifth transistor signal 295 to provide a measurement result; (f) evaluate, based upon the measurement result, the predefined value and a gain factor, a value of a compensation signal 296 to be provided to a feedback node of another pixel (such as feedback node 374 of pixel 340 that is connected to fourth and fifth transistors 354 and 355 of pixel 340) that is connected to the second node 272 via a feedback capacitor 290; wherein the gain factor is indicative of a ratio between changes in a voltage of the feedback node 374 and changes induced in the voltage of the second node 272 as a result of the changes in the voltage of the feedback node 374; and (g) provide the compensation signal 296 to the feedback node 374. The compensation signal 296 changes the voltage of the feedback node 374 and this in turn changes (by the gain factor) the voltage of the second node 272 and thus compensates (reduced or even eliminates) any noises introduced to the second node 272 due to the reset and the activation of the second transistor 252.

Pixel 340 includes a photodiode 360 and first till fifth transistors 351-355. The photodiode 360, the first transistor 351 and the second transistor 352 are connected to a first node 371. The second transistor 351, third transistor 353 and fourth transistor 354 are connected to a second node 372. The fifth transistor 355 is connected between the fourth transistor 354 and a first conductor 381. The control circuit 30 may be arranged to: (a) activate the first transistor 351 to facilitate a reset of the photodiode 360, (b) activate the third transistor 353 to set a voltage of a second node 372 to a predefined value; (c) deactivate the first transistor 351 and activate the second transistor 352; (d) deactivate the third transistor 353 and activate the fourth and fifth transistors 354 and 355 to allow a reception of a fifth transistor signal 395 indicative of the voltage of the second node 372; (e) measure the fifth transistor signal 395 to provide a measurement result; (f) evaluate, based upon the measurement result, the predefined value and a gain factor, a value of a compensation signal 396 to be provided to a feedback node of another pixel (such as feedback node 474 of pixel 440 that is connected to fourth and fifth transistors 454 and 455 of pixel 440) that is connected to the second node 372 via a feedback capacitor 390; wherein the gain factor is indicative of a ratio between changes in a voltage of the feedback node 474 and changes induced in the voltage of the second node 372 as a result of the changes in the voltage of the feedback node 474; and (g) provide the compensation signal 396 to the feedback node 474. The compensation signal changes the voltage of the feedback node 474 and this in turn changes (by the gain factor) the voltage of the second node 372 and thus compensates (reduced or even eliminates) any noises introduced to the second node 372 due to the reset and the activation of the second transistor 352.

Figure 3:
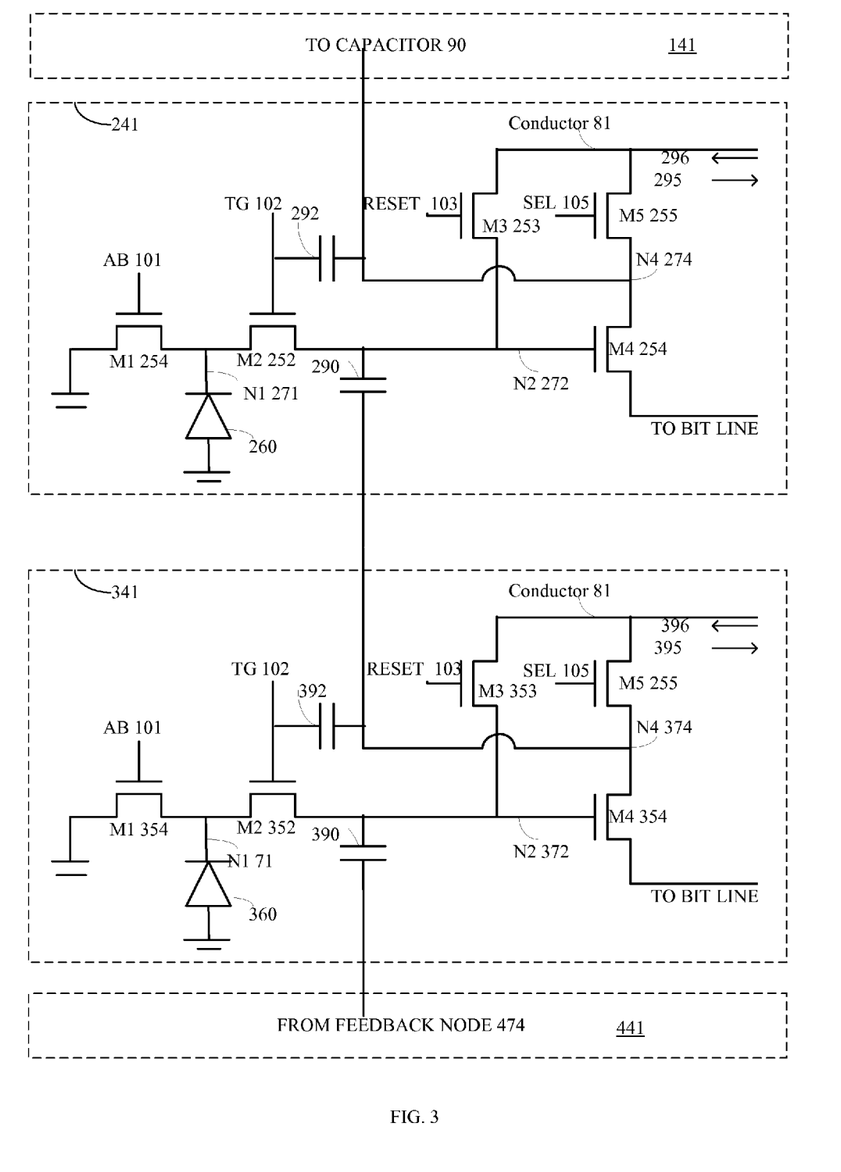
FIG. 3 illustrates multiple pixels according to an embodiment of the invention.

FIG. 3 illustrates multiple pixels 141, 241, 341 and 441 according to an embodiment of the invention.

Pixels 141 and 441 are illustrates as boxes, for simplicity of explanation only.

Pixels 141, 241, 341 and 441 are ideally identical from each other. They differ from pixels 140, 240, 340 and 440 of FIG. 2 by including an additional capacitor (such as additional capacitors 292 and 392) that is connected between the gate of the second transistor (such as 252 and 352) and the feedback node (such as 274 and 374).

Referring to pixel 240—the additional capacitor 292 may prevent the fifth transistor 254 to be opened as result of an opening of the second transistor 252. This opening may erase the information stored at the second node 272. The additional capacitor 292 allows a boost of the voltage of the feedback node 274 as a result of a similar increase of the voltage of first node 271 (both resulting from opening the second transistor of the pixel) and prevents the fifth transistor 275 to be opened.

Figure 4:
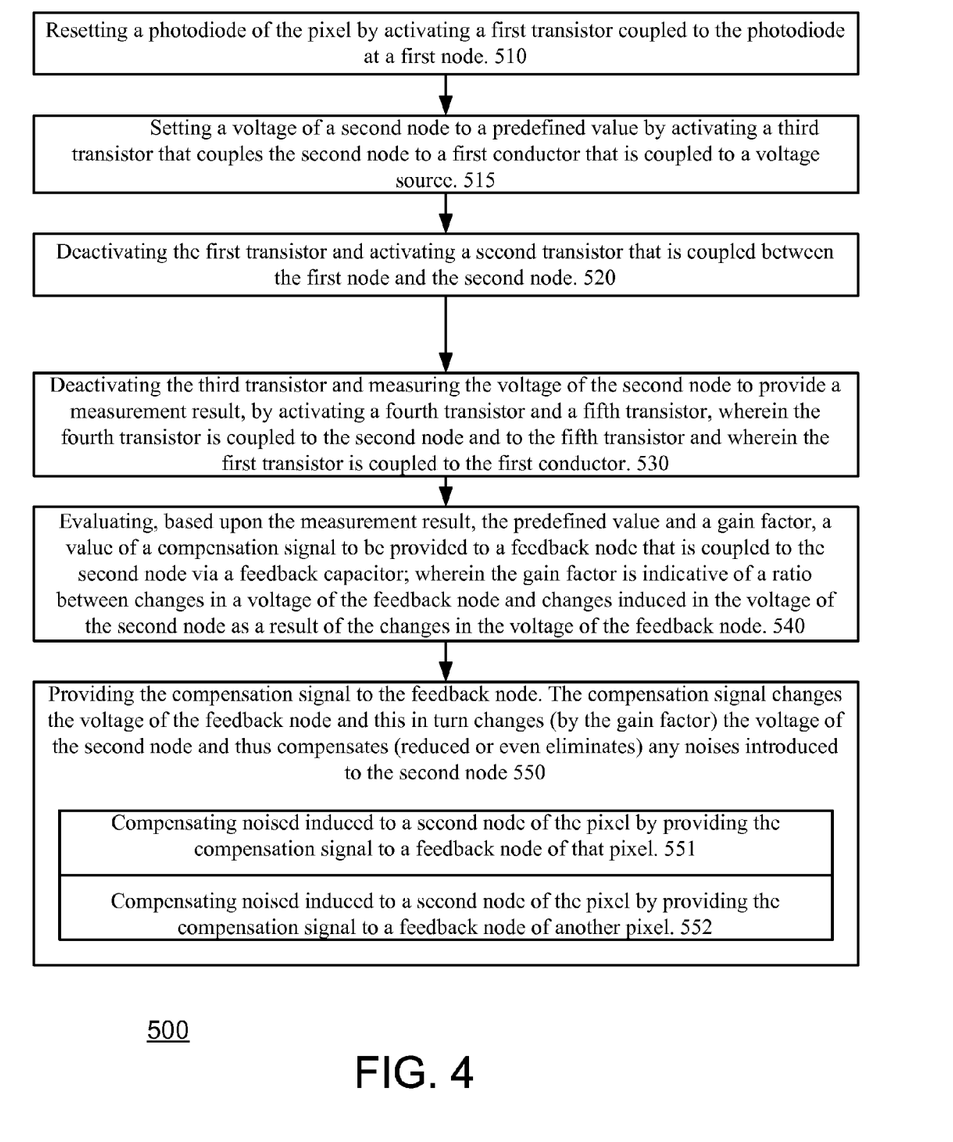
FIG. 4 illustrates a method according to an embodiment of the invention.

FIG. 4 illustrates method 500 for reset noise compensation, according to an embodiment of the invention.

The reset noise compensation process can be executed before an integration period during which a photodiode of a pixel is exposed to light. Method 500 can be executed by a device that may includes an array of pixels such as pixel 40 of FIG. 1.

Method 500 starts by stage 510 of resetting a photodiode of the pixel by activating a first transistor coupled to the photodiode at a first node.

Method 500 may also include stage 515 of setting a voltage of a second node to a predefined value by activating a third transistor that couples the second node to a first conductor that is coupled to a voltage source. Stage 515 may prepare the second node for charge transfer upon a completion of a light integration period.

Stage 510 may be executed before starting a light integration phase and stage 515 may follow a completion of the light integration phase.

Stage 510 may be followed by stage 520 of deactivating the first transistor and activating a second transistor that is coupled between the first node and the second node.

Stage 520 may be followed by stage 530 of deactivating the third transistor and measuring the voltage of the second node to provide a measurement result, by activating a fourth transistor and a fifth transistor, wherein the fourth transistor is coupled to the second node and to the fifth transistor and wherein the first transistor is coupled to the first conductor.

Stage 530 may be followed by stage 540 of evaluating, based upon the measurement result, the predefined value and a gain factor, a value of a compensation signal to be provided to a feedback node that is coupled to the second node via a feedback capacitor; wherein the gain factor is indicative of a ratio between changes in a voltage of the feedback node and changes induced in the voltage of the second node as a result of the changes in the voltage of the feedback node.

Stage 540 may be followed by stage 550 of providing the compensation signal to the feedback node. The compensation signal changes the voltage of the feedback node and this in turn changes (by the gain factor) the voltage of the second node and thus compensates (reduced or even eliminates) any noises introduced to the second node.

The feedback node can belong to the same pixel whose second node voltage is amended. In this case stage 550 may include stage 551 of compensating noised induced to a second node of the pixel by providing the compensation signal to a feedback node of that pixel. An example of such scenario is provided in FIG. 1.

The feedback node can belong to another pixel that differs from the pixel whose second node voltage is amended. In this case stage 550 may include stage 552 of compensating noised induced to a second node of the pixel by providing the compensation signal to a feedback node of another pixel. An example of such scenario is provided in FIGS. 2 and 3.

According to an embodiment of the invention stages 530-550 may include multiple iterations of (a) resetting a second node, (b) measuring the noise of the second node, (c) storing the measured result in a readout memory, (d) applying a compensation signal to the fourth node, the compensation signal may be calculated based upon based upon a measurement result stored in the readout memory.

While FIG. 4 illustrates a single iteration of measuring, evaluating and providing of the compensation signal, there can be multiple iterations. Additionally or alternatively each iteration (or a subset of these iterations) can include a stage of determining whether (and optionally how) to execute a next iteration. This is illustrated in FIG. 5.

Figure 5:
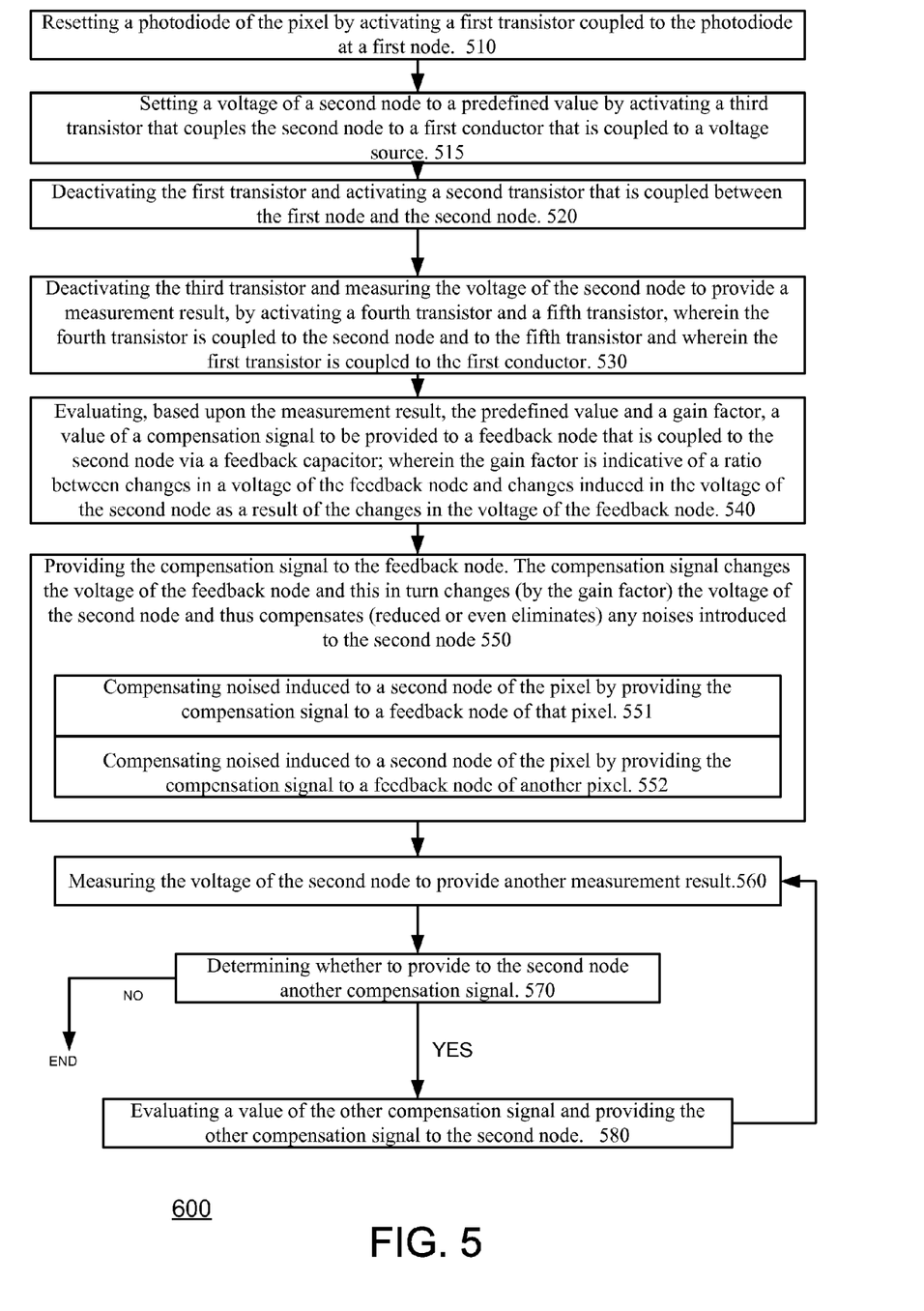
FIGS. 5-7 illustrate methods according to an embodiment of the invention.

FIG. 5 illustrates method 600 for reset noise compensation, according to an embodiment of the invention.

Method 600 differs from method 500 by including stages 560, 570 and 580.

Method 600 can be executed by a device that may includes an array of pixels such as pixel 40 of FIG. 1.

Stage 560 may follow stage 550 and may include measuring the voltage of the second node to provide another measurement result.

Stage 560 may be followed by stage 570 of determining whether to provide to the second node another compensation signal.

If it is determined to provide the other compensation signal then stage 570 may be followed by stage 580 of evaluating a value of the other compensation signal and providing the other compensation signal to the second node. Stage 580 may be followed by stage 550.

Figure 6:
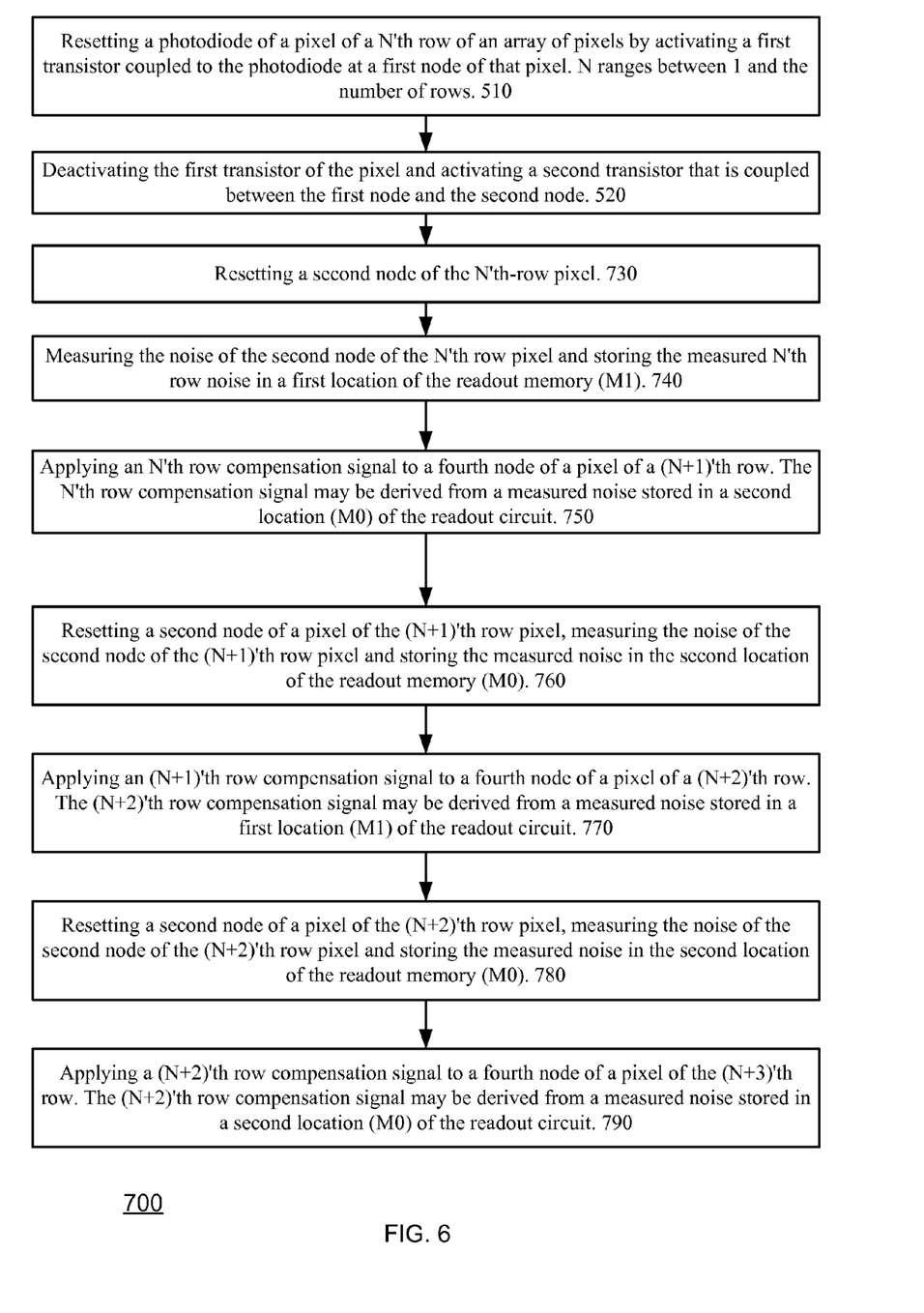

FIG. 6 illustrates method 700 according to an embodiment of the invention.

Method 700 may start by stage 510 of resetting a photodiode of a pixel of a N'th row of an array of pixels by activating a first transistor coupled to the photodiode at a first node of that pixel. N ranges between 1 and the number of rows.

Stage 510 may be followed by stage 520 of deactivating the first transistor of the pixel and activating a second transistor that is coupled between the first node and the second node.

Stage 520 may be followed by stage 730 of resetting a second node of the N'th-row pixel.

Stage 730 may be followed by stage 740 of measuring the noise of the second node of the N'th row pixel and storing the measured N'th row noise in a first location of the readout memory (M1).

Stage 740 may be followed by stage 750 of applying an N'th row compensation signal to a fourth node of a pixel of a (N+1)'th row. The N'th row compensation signal may be derived from a measured noise stored in a second location (M0) of the readout circuit.

Stage 750 may be followed by stage 760 of resetting a second node of a pixel of the (N+1)'th row pixel, measuring the noise of the second node of the (N+1)'th row pixel and storing the measured noise in the second location of the readout memory (M0).

Stage 760 may be followed by stage 770 of applying an (N+1)'th row compensation signal to a fourth node of a pixel of a (N+2)'th row. The (N+2)'th row compensation signal may be derived from a measured noise stored in a first location (M1) of the readout circuit.

Stage 770 may be followed by stage 780 of resetting a second node of a pixel of the (N+2)'th row pixel, measuring the noise of the second node of the (N+2)'th row pixel and storing the measured noise in the second location of the readout memory (M0).

Stage 780 may be followed by stage 790 of applying a (N+2)'th row compensation signal to a fourth node of a pixel of the (N+3)'th row. The (N+2)'th row compensation signal may be derived from a measured noise stored in a second location (M0) of the readout circuit.

Due to the proximity of rows, the resetting of the second node of the pixel of the N'th row may require resetting the fourth and second nodes of pixels of the (N+1)'th row to some pre-determined value that may be deterministic and should not be floating.

According to another embodiment of the invention either one of the measuring of the noise and storing the measured noise can be delayed.

Figure 7:
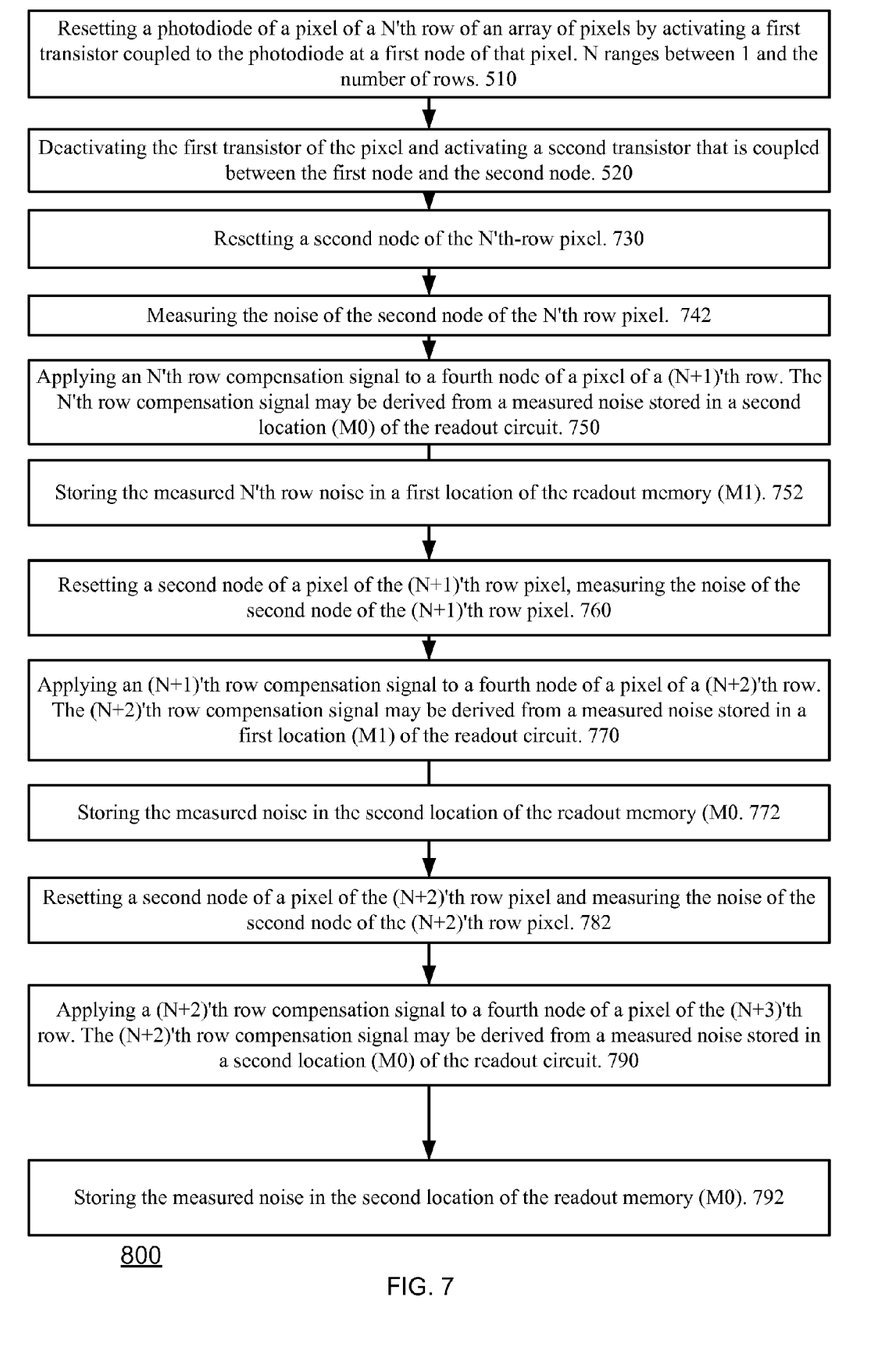

FIG. 7 illustrates method 800 according to an embodiment of the invention.

Method 800 may start by stage 510 of resetting a photodiode of a pixel of a N'th row of an array of pixels by activating a first transistor coupled to the photodiode at a first node of that pixel. N ranges between 1 and the number of rows.

Stage 510 may be followed by stage 520 of deactivating the first transistor of the pixel and activating a second transistor that is coupled between the first node and the second node.

Stage 520 may be followed by stage 730 of resetting a second node of the N'th-row pixel.

Stage 730 may be followed by stage 742 of measuring the noise of the second node of the N'th row pixel.

Stage 742 may be followed by stage 750 of applying an N'th row compensation signal to a fourth node of a pixel of a (N+1)'th row. The N'th row compensation signal may be derived from a measured noise stored in a second location (M0) of the readout circuit.

Stage 750 may be followed by stage 752 of storing the measured N'th row noise in a first location of the readout memory (M1).

Stage 752 may be followed by stage 762 of resetting a second node of a pixel of the (N+1)'th row pixel and measuring the noise of the second node of the (N+1)'th row pixel.

Stage 762 may be followed by stage 770 of applying an (N+1)'th row compensation signal to a fourth node of a pixel of a (N+2)'th row. The (N+2)'th row compensation signal may be derived from a measured noise stored in a first location (M1) of the readout circuit.

Stage 770 may be followed by stage 772 of storing the measured noise in the second location of the readout memory (M0).

Stage 772 may be followed by stage 782 of resetting a second node of a pixel of the (N+2)'th row pixel and measuring the noise of the second node of the (N+2)'th row pixel.

Stage 782 may be followed by stage 790 of applying a (N+2)'th row compensation signal to a fourth node of a pixel of the (N+3)'th row. The (N+2)'th row compensation signal may be derived from a measured noise stored in a second location (M0) of the readout circuit.

Stage 790 may be followed by stage 792 of storing the measured noise in the second location of the readout memory (M0).

Due to the proximity of rows, the resetting of the second node of the pixel of the N'th row may require resetting the fourth and second nodes of pixels of the (N+1)'th row to some pre-determined value that may be deterministic and should not be floating.

It is noted that the determination may be responsive to the estimated deviation from the voltage of the second node to a desired voltage level (for example—a supply voltage level).

In the foregoing specification, the invention has been described with reference to specific examples of embodiments of the invention. It will, however, be evident that various modifications and changes may be made therein without departing from the broader spirit and scope of the invention as set forth in the appended claims.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Although specific conductivity types or polarity of potentials have been described in the examples, it will be appreciated that conductivity types and polarities of potentials may be reversed.

Each signal described herein may be designed as positive or negative logic. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Furthermore, the terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality.

Any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device. Alternatively, the examples may be implemented as any number of separate integrated circuits or separate devices interconnected with each other in a suitable manner.

Also for example, the examples, or portions thereof, may implemented as soft or code representations of physical circuitry or of logical representations convertible into physical circuitry, such as in a hardware description language of any appropriate type.

Also, the invention is not limited to physical devices or units implemented in non-programmable hardware but can also be applied in programmable devices or units able to perform the desired device functions by operating in accordance with suitable program code, such as mainframes, minicomputers, servers, workstations, personal computers, notepads, personal digital assistants, electronic games, automotive and other embedded systems, cell phones and various other wireless devices, commonly denoted in this application as 'computer systems'.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements The mere fact that certain measures are recited in mutually different claims does not indicate that a combination of these measures cannot be used to advantage.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

I claim:

1. A method for reset noise compensation, the method comprises:
   resetting a photodiode of the pixel by activating a first transistor coupled to the photodiode at a first node;
   setting a voltage of a second node to a predefined value by activating a third transistor that couples the second node to a first conductor that is coupled to a voltage source;
   deactivating the first transistor and activating a second transistor that is coupled between the first node and the second node;
   deactivating the third transistor and measuring the voltage of the second node to provide a measurement result, by activating a fourth transistor and a fifth transistor, wherein the fourth transistor is coupled to the second node and to the fifth transistor and wherein the first transistor is coupled to the first conductor;
   evaluating, based upon the measurement result, the predefined value and a gain factor, a value of a compensation signal to be provided to a feedback node that is coupled to the second node via a feedback capacitor; wherein the gain factor is indicative of a ratio between changes in a voltage of the feedback node and changes induced in the voltage of the second node as a result of the changes in the voltage of the feedback node; and
   providing the compensation signal to the feedback node.

2. The method according to claim 1, comprising:
   measuring, after completion of the providing of the compensation signal, the voltage of the second node to provide another measurement result;
   determining whether to provide to the second node another compensation signal; and
   if it is determined to provide the other compensation signal then evaluating a value of the other compensation signal and providing the other compensation signal to the second node.

3. The method according to claim 2, wherein the gain factor is smaller than ten percent.

4. The method according to claim 1, wherein the gain factor is smaller than twenty percent.

5. The method according to claim 1, wherein the gain factor ranges between ten percent and two percent.

6. The method according to claim 1, wherein the pixel comprises the feedback node.

7. The method according to claim 6, wherein the pixel comprises a sixth transistor that is coupled to the feedback node; wherein the providing of the compensation signal comprises activating the sixth transistor.

8. The method according to claim 1, wherein the feedback node belongs to another pixel.

9. The method according to claim 8, wherein the other pixel is adjacent to the pixel.

10. The method according to claim 8, wherein the feedback node is coupled to between a fourth transistor and a fifth transistor of the other pixel.

11. The method according to claim 10, wherein the feedback node is coupled to a second transistor of the other pixel.

12. The method according to claim 1 wherein the pixel belongs to an array of pixels that are activated simultaneously.

13. A device, comprising a pixel and a control circuit;
wherein the pixel comprises a photodiode and first till fifth transistors; wherein the photodiode, the first transistor and the second transistor are coupled to a first node; wherein the second transistor, third transistor and fourth transistor are coupled to a second node; wherein the fifth transistor is coupled between the fourth transistor and a first conductor;
wherein the control circuit is arranged to:
activate the first transistor to facilitate a reset of the photodiode;
activate the third transistor to set a voltage of a second node to a predefined value;
deactivate the first transistor and activate the second transistor;
deactivate the third transistor and activate the fourth and fifth transistors to allow a reception of a fifth transistor signal indicative of the voltage of the second node;
measure the fifth transistor signal to provide a measurement result;
evaluate, based upon the measurement result, the predefined value and a gain factor, a value of a compensation signal to be provided to a feedback node that is coupled to the second node via a feedback capacitor;
wherein the gain factor is indicative of a ratio between changes in a voltage of the feedback node and changes induced in the voltage of the second node as a result of the changes in the voltage of the feedback node; and
provide the compensation signal to the feedback node.

14. The device according to claim 13, wherein the control circuit is arranged to deactivate the third transistor and activate the fourth and fifth transistors to allow an another reception of the fifth transistor signal; measure the fifth transistor signal to provide another measurement result; determine whether to provide to the second node another compensation signal; and if it is determined to provide the other compensation signal then evaluate a value of the other compensation signal and provide the other compensation signal to the second node.

15. The device according to claim 13, wherein the gain factor is smaller than twenty percent.

16. The device according to claim 13, wherein the gain factor ranges between ten percent and two percent.

17. The device according to claim 13, wherein the gain factor is smaller than ten percent.

18. The device according to claim 13, wherein the pixel comprises the feedback node.

19. The device according to claim 18, wherein the pixel comprises a sixth transistor that is coupled to the feedback node; wherein the control circuit is arranged to provide the compensation signal by activating the sixth transistor.

20. The device according to claim 13, wherein the feedback node belongs to another pixel.

21. The device according to claim 20, wherein the other pixel is adjacent to the pixel.

22. The device according to claim 20, wherein the feedback node is coupled to between a fourth transistor and a fifth transistor of the other pixel.

23. The device according to claim 22, wherein the feedback node is coupled to a second transistor of the other pixel.

24. The device according to claim 13, wherein the pixel belongs to an array of pixels that are activated simultaneously.

* * * * *